United States Patent
Kruit et al.

(10) Patent No.: US 8,325,321 B2
(45) Date of Patent: Dec. 4, 2012

(54) LITHOGRAPHY SYSTEM, METHOD OF HEAT DISSIPATION AND FRAME

(75) Inventors: Pieter Kruit, EB Delft (NL); Michel Pieter Dansberg, XK Delft (NL); Marco Jan-Jaco Wieland, XK Delft (NL)

(73) Assignee: Mapper Lithography IP B.V., Delft (NL)

( * ) Notice: Subject to any disclaimer, the term of this patent is extended or adjusted under 35 U.S.C. 154(b) by 410 days.

(21) Appl. No.: 11/880,833

(22) Filed: Jul. 24, 2007

(65) Prior Publication Data

US 2008/0024743 A1 Jan. 31, 2008

Related U.S. Application Data

(60) Provisional application No. 60/833,865, filed on Jul. 28, 2006.

(51) Int. Cl.
*F28D 15/00* (2006.01)
*G03B 27/42* (2006.01)
*G03B 27/52* (2006.01)
*G03B 27/58* (2006.01)
*G03B 27/62* (2006.01)

(52) U.S. Cl. ............... 355/30; 355/53; 355/72; 355/75; 165/104.21

(58) Field of Classification Search .................. 355/30, 355/53, 72, 75, 77; 250/492.1–492.22; 361/324, 361/234; 165/104.13, 104.21, 104.22; 279/3, 279/128; 310/12.05–12.06
See application file for complete search history.

(56) References Cited

U.S. PATENT DOCUMENTS

| | | | | |
|---|---|---|---|---|
| 4,911,232 A | * | 3/1990 | Colvin et al. | 165/104.17 |
| 5,220,171 A | * | 6/1993 | Hara et al. | 250/443.1 |
| 5,500,540 A | * | 3/1996 | Jewell et al. | 257/82 |
| 6,686,598 B1 | * | 2/2004 | Walther | 250/492.21 |
| 7,528,349 B1 | | 5/2009 | Gotkis et al. | |

(Continued)

FOREIGN PATENT DOCUMENTS

JP 07226371 A * 8/1995

(Continued)

OTHER PUBLICATIONS

Specification Sheets for Rubitherm GR, Rubitherm RT-21, printed from http://www.rubitherm.de/english/index.htm on Feb. 24, 2012.*

*Primary Examiner* — Hung Henry Nguyen
*Assistant Examiner* — Colin Kreutzer
(74) *Attorney, Agent, or Firm* — Hoyng Monegier LLP; David P. Owen; Coraline J. Haitjema

(57) ABSTRACT

The present invention relates to a lithography system for projecting an image or an image pattern on to a target such as a wafer. Energy that is accumulated in the target by the projection of the image or image pattern is removed from said target, such that expansion by local and/or overall heating is limited to a relevant pre-defined value, and wherein such heat removal is realised by the use of a phase transition in a heat absorbing material that is brought into thermal contact with said target. As a further elaboration, such material may be applied in combination with a further material having a superior coefficient of heat transport, and may be incorporated in an emulsion comprising a material having a superior coefficient of heat transfer. Said material may e.g. be adhered to a bottom face of the target, and may also be included in a frame.

17 Claims, 3 Drawing Sheets

U.S. PATENT DOCUMENTS

| | | | |
|---|---|---|---|
| 2002/0101956 A1* | 8/2002 | Hara et al. | 378/34 |
| 2003/0010292 A1* | 1/2003 | Kholodenko et al. | 118/728 |
| 2004/0079518 A1* | 4/2004 | del Puerto et al. | 165/58 |
| 2005/0128448 A1* | 6/2005 | Box et al. | 355/53 |
| 2005/0128449 A1* | 6/2005 | Phillips | 355/53 |
| 2005/0254028 A1* | 11/2005 | Box | 355/53 |
| 2006/0087637 A1* | 4/2006 | Ottens et al. | 355/72 |
| 2006/0102277 A1* | 5/2006 | Zaal et al. | 156/290 |
| 2007/0002303 A1* | 1/2007 | Van De Moosdijk et al. | 355/72 |
| 2007/0268476 A1* | 11/2007 | Phillips et al. | 355/75 |

FOREIGN PATENT DOCUMENTS

WO     WO 2008013443 A2 *   1/2008

* cited by examiner

LITHOGRAPHY SYSTEM, METHOD OF HEAT DISSIPATION AND FRAME

The present patent application is a non-provisional application claiming the priority of U.S. Provisional Application No. 60/833,865, filed Jul. 28, 2006.

BACKGROUND OF THE INVENTION

The present invention relates to a lithography system for projecting an image pattern on to a target surface such as a wafer.

Field of the Invention

Such systems are generally known, e.g. in the form of a mask writer or in the form of a lithography application as in WO 2004038509. In the example presented by the latter system, the target to be patterned is subjected to incidence of photons or charged particles such as ions and electrons. Due to the energy load of such particles or photons, inherent to the manner of extracting or emitting the same, the target is at least locally heated. Such heating, in accordance with an insight developed as part of the invention, becomes problematic when expansion of the target under influence by it's processing exceeds a pre-defined value. In general it was observed that heating becomes problematic with the ever continuing, contemporary development towards high throughput.

As a general idea underlying the present invention it is understood that heat development and its removal from the target to be processed will be problematic in all sort of lithography. This may e.g. be due to ever decreasing size of nodes and/or to tighter overlay prescription, and is also problematic in contemporary emerging, vacuum types of lithography.

Thus, with contemporary development in demand of accuracy and miniaturization, all type of lithography deal with the problem of heat inducement, e.g. mask based such as conventional lithography or mask based electron beam lithography such as Scalpel. Such heat inducement may lead to instability of target temperature, in fact instability in expansion of the target such as a wafer. In this respect it is remarked that irrespective of the manner of transferring a pattern on to a target, accuracy, especially in relation to the aspect of overlay in wafers, becomes more and more critical with increasing resolution of such patterns. An important issue in controlling the accuracy of patterning is controlling the temperature stability of the target during exposure. It is therefore an important aspect of both conventional or other mask based lithography, and maskless lithography to realize a swift and adequate manner of heat dissipation from a wafer that is being processed.

Yet another circumstance urging lithography to find solutions related to heat removal from wafers in progress is found at current methods of lithography that will, with increasing demands in specifications, shift from present atmospheric processing of targets towards vacuum processing thereof, such as may be expected at EUV processing of targets. Such a transition will imply that currently known methods of heat transfer can no longer be applied, and that new methods of heat transfer are required.

In general it can be stated that with inducement of heat to a wafer or kind like target, the target expands, which results in a difference between the actual and expected position and dimension of e.g. a die on said target, which will result in an error of the exposure pattern on the target.

It is remarked however, that apart from throughput, also critical dimension influences the temperature stability of a target through its relation with shot noise: the smaller the desired critical dimension, the larger the dose.

Precise positioning of patterns, e.g. within a prescribed range, is of significant importance given various stages in which a target is normally treated, possibly by different types of lithography apparatuses. A main solution in this respect is to remove heat from the wafer, thereby limiting expansion, at least controlling the magnitude of positioning error. Known practices of removing heat appear however to be insufficient for removing the heat that is developed in nowadays and future direct write and other litho systems, which may e.g. at maskless e-beam lithography be in the order of hundred thousands of charged particle beams per die, alternatively put per slit. Such is in particular insufficient in case throughput of the system is not to be compromised.

While various manners of removing heat have been evaluated by the applicant, the major problems associated therewith seem to be both the capacity of heat to be taken over and speediness of the transport thereof, i.e. towards a heat absorbing metal block located to the back of a wafer. The latter phenomenon is in the art known mostly referred to by the term thermal diffusivity, which thus is observed to be insufficient in many cases. In such evaluated cases, often either the heat absorbing capacity is absorbed while dimensioning of the absorbing body already is problematic, or the transfer of heat is so slow that the level of heat at the target remains unacceptably high. As to capacity of heat to be absorbed it is remarked that metals like copper, though showing a superb diffusivity, can not be applied given the volume required for absorbing heat induced at the target. Also other examples of removing heat such as using cooling water appear to be inappropriate for many nowadays and forthcoming types of lithography systems. It is thus an object of the invention to provide for a compact means of transporting and absorbing heat from a wafer, i.e. operable in vacuum, preferably at room temperature.

Description of Related Art

Known solutions in the art comprise anticipation of heat expansion by means of software control of the pattern to be projected, as is e.g. provided by patent publication US2002/0147507. The latter document teaches the use of an adaptive, Kalman filter to control electron beam placement, and thereby wafer heating, possibly implemented in a real time process control. This technology however does not address the fundamental problem of temperature stability and heat removal as desired by modern lithography systems.

US patent publication 2005/0186517 teaches to cause opposite stress against wafer expansion after an initial stress relieving expansion of a wafer chuck, thereby potentially doubling the amount of allowed heating of the wafer before undesired slip between wafer and chuck occurs.

In PCT/US01/26772 a wafer clamp is disclosed which is favourably used for transport of heat induced by a charged particle beam on a target. Clamping of a wafer on to a supporting structure is in this known device performed by applying "one or more" phase transitions to a clamping component that is applied between a wafer and a supporting structure, which phase transitions "facilitate various operations throughout the process" and "ensure that the wafer may be easily loaded and released from the structure. The clamping component is applied in a liquid or gaseous form, and brought into a solid state by active cooling of the support structure, so as to achieve a solid clamping of wafer to said structure. It is here concluded that such a manner of clamping can basically be denoted as gluing the wafer.

The known device is indicated to be "particularly useful in processes that require wafer cooling". In particular "the clamping apparatus provides highly efficient cooling in vacuum due to the large contact area between component and wafer, and the high thermal conductivity of the clamping component". This background document is however silent to the manner of cooling relatively high inductance of heat, as may occur in modern apparatus with very high throughput in terms of wafers per hour.

BRIEF SUMMARY OF THE INVENTION

The present invention provides a solution to the problem of heat transfer as described earlier, i.e. within a limited amount of space, with relatively high capacity and swift transfer of heat, without unduly complicating the process of loading or locating a target to be cooled within the stage of a direct write lithography machine.

In this respect the invention is characterised in that energy that is accumulated in a target by the projection of said image or image pattern is removed from said target in such a manner that expansion by local and overall heating of said target is limited to a relevant pre-defined value, wherein such heat removal is realised by the use of a phase transition in a heat absorbing material that is brought into thermal contact with said target.

It is thus understood by the invention that a phase transition in itself may be effectively used for absorbing heat from a lithography target. In a phase transition, to a lesser or larger extend, the temperature of the material in transition remains at least virtually constant, i.e. varies with a relatively much less extend than outside said phase transition, with sustained application of heat to said material. Surprisingly, by using this phenomenon for the purpose of heat removal, a very compact and sophisticated manner of cooling a lithography target is achieved.

It was found however, as an aspect underlying the invention, that materials providing superior capability of heat absorption without undue raise of temperature during such phase transition, could suffer from strongly limited thermal diffusivity, especially in a layer that had in mean time undergone the phase transition, the effect being that that overall thermal diffusivity of the material body is determined by said first transited layer. It is therefore a further aspect of the invention that such material of superior heat absorbing capacity is combined with a further material having a relatively superior coefficient of heat transport.

In first embodiment of the latter aspect of the invention the combined material is mixed with the first material in a solution, most preferably in an emulsion. In a further presently preferred embodiment, the combined material is a honeycomb-like structure, preferably entirely enclosing the heat absorbing material. According to yet a further aspect of the invention, the two embodiments are combined. Such heat conducting material may e.g. be a metal, e.g. in the form of metal particles in case of a solution.

According to yet a further aspect of the invention, said phase transition should preferably take place at a temperature corresponding to the operational temperature of the lithography machine already improved in accordance with the invention, thereby also enhancing handling and functional aspects related to the overall operation of the machine. In a more particular embodiment such phase transition is to take place at a temperature around room temperature. So as to meet all of these above requirements, according to the invention, hexadecane is currently used as a heat absorbing material.

In applying hexadecane or any other liquid heat absorbing material, because of the use of said phase transition, only a very limited amount of material is required for absorbing heat induced by the majority of types of lithography machines. The material may therefore in principle simply be adhered to the backside of e.g. a wafer, where a layer of very limited thickness may suffice for heat absorption without undue raise in temperature.

The reason for the at first sight highly surprising choice for a material like hexadecane—due to ultimately bad conductance of heat (0.144 W/m.K for hexadecane as opposed to 140 for silicon)—has in fact been explained in the preceding: the invention teaches that a badly heat conducting materials like hexadecane can favourably be used as a heat absorbing material if these are used in and around a phase transition condition and if these are combined with a surface enlarging structure embodied in a very well heat conducting material.

In accordance with yet a further aspect of the invention the heat absorbing material is included in the litho machine in a porous structure, typically composed of the earlier mentioned heat conducting material. In such case the structure is brought into thermal contact with the target, e.g. a wafer. The invention in principle however also relates to a target such as a wafer of which the backside is provided porous, e.g. by bore holes, e.g. realised using etching techniques. In this manner, contacting surface is strongly increased without the need of an intermediate conducting material.

BRIEF DESCRIPTION OF THE DRAWINGS

The invention will be further elucidated by way of example in the following embodiments of a mask-less lithography system according to the current invention, in which.

In the figures, corresponding structural features, i.e. at least functionally corresponding, are referred to by identical reference numbers.

DETAILED DESCRIPTION OF THE INVENTION

Figure 1:
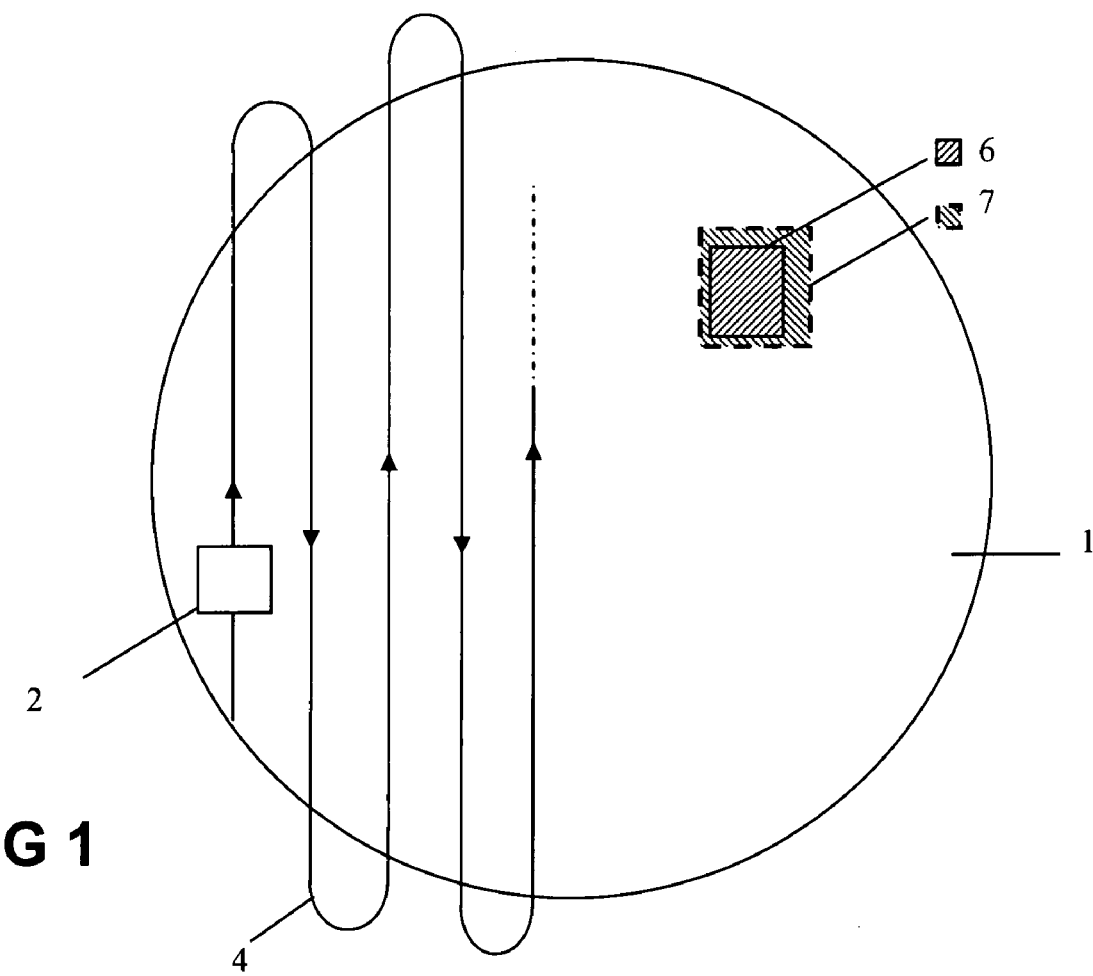
FIG. 1 schematically illustrates a lithography target, here as a top view of a wafer, and the effect thereon caused by induced heating.

FIG. 1 shows a target, here in the form of a wafer 1, which moves relative to e.g. a charged particle beam column of a litho apparatus, or other kind of beam source for lithography, according to path 4, here indicating the centre of a lens assembly or slit 2, passing over several fields 6 of the wafer.

Due to induced heat to the wafer, by the incidence of said charged particle beams—the wafer will expand. This expansion results in a difference between the expected position and dimension of a die 6 and the actual position and dimension of a die 7. This difference will result in an overly error of the exposure pattern on the wafer.

Figure 4:
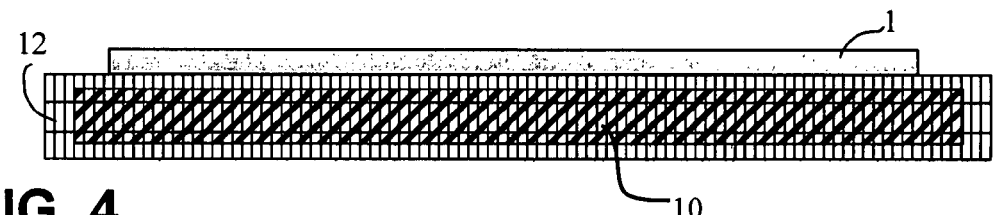
FIG. 4 is alike FIG. 3, a schematic representation however of a second embodiment of the invention in which in this case fluid heat absorbing material is included in a framed structure that is brought into contact with the target.

In accordance now with the present invention, heat removal from said wafer is realized by the use of a phase transition in a material—here also denoted as phase change material—that is brought into thermal contact with said target 1, e.g. as illustrated by any of the embodiments of FIG. 4.

Figure 2A:
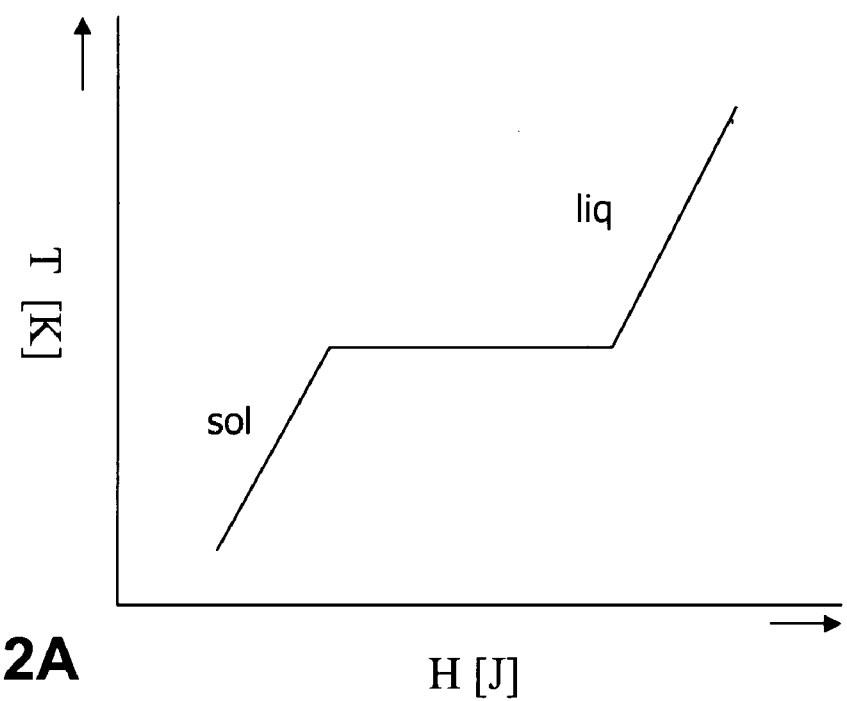
FIGS. 2A and 2B represent a temperature characteristic of a phase transition of a material, which is favourably used in the invention.
Figure 2B:
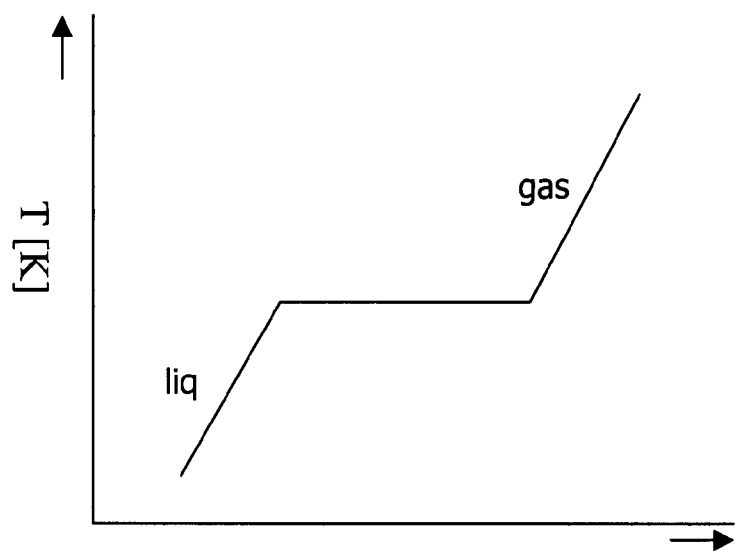

FIG. 2 illustrates the principle of such phase transition, in FIG. 2A by the transition of a heat absorbing means from solid state Sol to liquid state Liq, and in FIG. 2B by the transition from liquid state Liq to gaseous state Gas. In both figures the temperature T of the absorbing means is set out (in degrees Kelvin) against the heat H (in Joules) induced by an impinging charged particle beam. It can be seen that during the transition from solid phase to liquid, or from liquid to gas, the temperature T does in principle not, and in practice only at a rather low rate, increase with increase of amount of heat H.

The above described effect is according to the invention favorably used in the practice for transport and accumulation of heat from a target to the absorbing means. A superior coefficient of heat transport is desired between target and heat absorber. Complementary to the above, a material having preferably both a large coefficient of heat transport and a transition phase temperature near environmental temperature of the target in said lithography apparatus is applied. Most preferably is a phase transition temperature near room temperature.

Further requirements to the heat absorber are according to the invention features like non-toxiness and ability to withstand the vacuum in which it is to operate, and CMOS compatibility.

In the above respects it was found that not many materials if any, provide the combination of features desired in the present application in full. The invention therefore proposes as a good and preferred material for application as a heat absorber, an emulsion comprising particles with a relatively high coefficient of heat transport such as metal or silicon. Such a material is relatively easily adhered to the bottom side of a target by adhesive force, and requires only a limited amount of space. In this respect a layer of several micrometers suffices. A preferred emulsion material is hexadecane. However, also glycerol ($C_3H_8O_3$; also well known as glycerin and glycerine, and less commonly as propane-1,2,3-triol, 1,2,3-propanetriol, 1,2,3-trihydroxypropane, glyceritol, glycyl alcohol, citifluor AF 2; grocolene) may be applied, in particular in enclosed form as will be illustrated hereafter. The invention addresses a finding that with a phase transition the heat transfer capacity of the heat absorbing material decreases to a minimum value. Such implies than only very thin layers of the phase change or heat absorbing material can be used. To overcome this problem the same heat absorbing material is still used, however in combination with a surface increasing measure.

Figure 3:
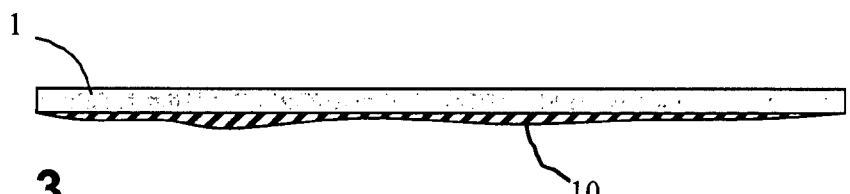
FIG. 3 represents a first embodiment of a relevant part of a lithography system, adapted for favourably removing heat from a lithography target.

FIG. 3 illustrates a first embodiment according to the invention, demonstrating a straight forward manner of putting the invented principle into practice. In the figure reference 1 is a cross section of a target in the form of a wafer, while 10 denotes an emulsion satisfying the needs defined in accordance with the invention.

FIG. 4 illustrates another embodiment, showing a porous carrier for said target and carrying the heat absorber in its pores. In this manner a large contacting area between heat absorber and target is created by means of said intermediate carrier.

A preference exists for a porous type of carrier, e.g. as in FIG. 4, on the basis of an idea that the coefficient of heat transport for an emulsion is strongly reduced once it is turned from solid state into fluid state. By means of a porous carrier, which may be either the target itself or a separate frame as in FIG. 4, heat by-passes heat absorbent that has fluidised in the upper zones thereof, thus guaranteeing an increased transfer of heat at any instant within the process of phase transition. In fact it may be stated that the carrier has an improved thermal conductance relative to a fluidised part of the heat absorbent. With a suitable heat conducting material such as metal or silicon, i.e. a wafer material, a homogeneous heating of the entire frame will in practice easily be achieved, thereby assuring that the heat absorbing material is contacted adequately over a highly enlarged surface area. The square holes or bores may be achieved by etching, and are in the present example of a dimension of 50 by 50 μm or smaller, with wall thicknesses of 5 μm or smaller.

Figure 5:
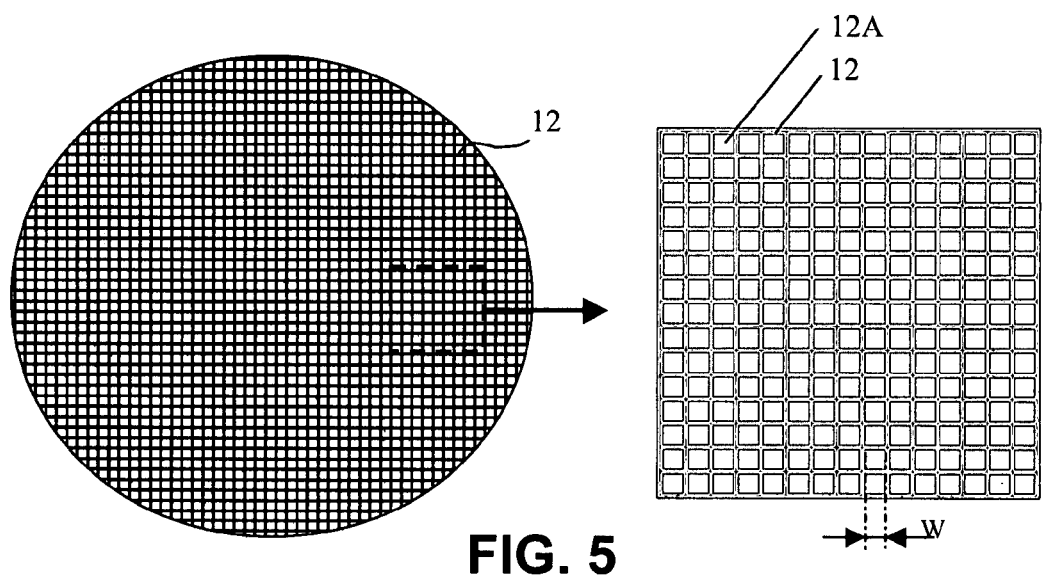
FIG. 5 is a schematic top view representation of the structure of FIG. 4, with an exploded view of part thereof, showing the internal grid structure.

FIG. 5 provides sectional views of a possible hexadecane frame as illustrated by FIG. 4. The left side figure part is an overall view of e.g. a wafer like structure, while the right side figure part illustrates a section as could be applicable to the size of a die in a wafer. In this example, in a die of 26 by 33 mm the number of square bores would thus be $(26*33 \text{ mm})/(50+5 \text{ μm})^2 = 283,640$. The goal of the frame is to increase the usable area of the PCM. According to Newton's law of conduction, $Q=(k*A/l)*dT$, the required temperature difference dT to transport a given amount of heat Q over a distance l, reduces with increasing surface A. By etching holes 12A in the bottom of the wafer 12, with a depth h, the usable surface per area W*W is increased to h*4*W for the shown geometry. Corresponding calculations also apply to a preferred frame with at least predominantly rectangular bores as taken in cross section. Such is embodied with the sort side of such shape considerably smaller in width than the width of the walls shaping said rectangular structure, preferably with a ratio within the range of 5 to 15, preferably around 10, thus e.g. bores or openings of a size of 50 by 5 micrometer, without these examples limiting the principle of increasing surface area by means of relatively long stretched openings. The degree of possible filling said structure with heat absorbing means is thereby increased, and preferably set to a value within the range of 60% to 90% surface area, e.g. around 75%.

Figure 6:
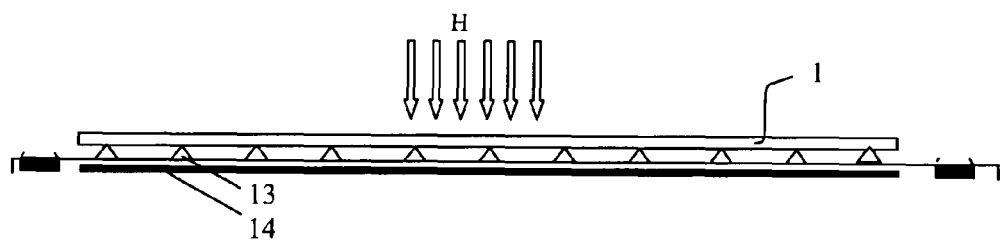
FIG. 6 is a schematic representation of a wafer and a supported by chuck as may be applied according to the invention.

FIG. 6 provides a schematic representation of a wafer and a wafer chuck as may for example be applied in accordance with the invention. To reduce the influence of backside particle contamination on the wafer, the wafer is placed on burls 13. By applying burls 13, the chance that a particle will be present between the wafer 1 and a burl 13 is minimised. To minimize focus errors because of wafer un-flatness, the wafer 1 is attracted on a very flat table made out of said burls. An electrostatic clamp 14 is applied in this respect, favourably meeting the vacuum condition of a stage. Other known or new type of clamps may in principle be applied as well however, an example of which is provided in the following. Typical values for applied attractive force are around 0.1 Bar or lower, depending on the applied manner of attraction. The dielectric properties of the material between wafer and clamp determine the achievable attractive force between wafer and clamp. The maximum allowable clamp voltage is limited by the breakthrough voltage and also depends on material and manufacturing process. Of course other manners of clamping may also be applied, without diminishing the significance of the present invention. With the presently proposed manner of clamping, for further optimisation, a fluid could be provided between the burled layer and the target, however strongly differing from the heat absorbing material, due to a desired function of improving heat conductance. In this respect the occurrence of a phase transition would for this material be highly undesired.

It was recognised that heat may in the current practice not conduct far in x and y direction, so that the number of burls is considerably increased compared to present common practice. The burls are preferably produced significantly smaller than conventional electrostatic clamping burls. Also, the total area of the burls is made significantly larger than conventional, i.e. with a function in clamping alone, or at least than without such added function of conduction of heat. In this respect the total contacting surface between target and burl is within the range of 1 to 5% of the total target surface, preferably around 1%. The latter and the increased number of burls implies an increased though accepted risk of particles trapped in between burls and wafer, distorting the flatness of the latter.

Figure 7:
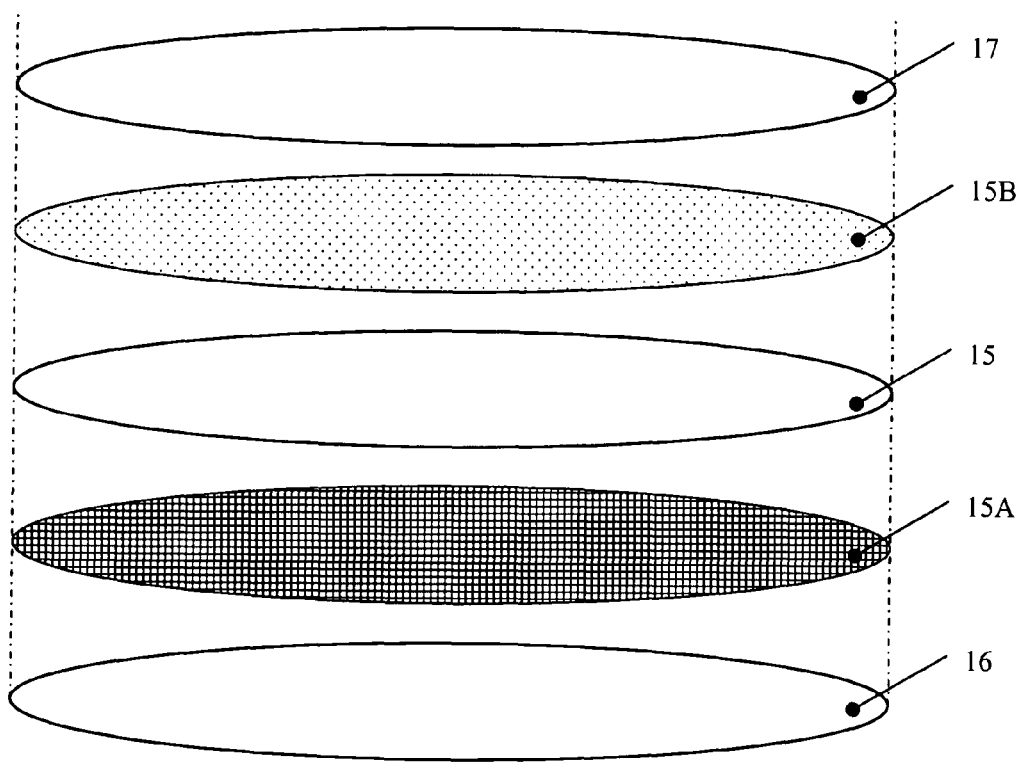
FIG. 7 schematically illustrates a workout of the principle illustrated along FIGS. 4 and 5.

FIG. 7 schematically illustrates one possible embodiment of the principle illustrated along FIGS. 4 and 5, in which the heat conducting frame is constituted by a wafer having an upper side 15, which is etched to the effect that burls 15B are created, in casu approximately 1 micron high burls. The opposite side 15A of the wafer is etched to the effect that bores are created for holding the heat absorbing material. The bottom layer 16 represented in FIG. 7 represents a frame closing layer attached to the bottom of the first layer and is here embodied by a second wafer. In this manner the heat absorbing material is shielded from the vacuum in which it is as in this example, very often to function. The top layer 17 present on the frame represented in FIG. 7, is a thermally conducting, electrically insulating layer. Such layer is applied, e.g. by sputtering, onto the surface burls including surface. In this case X micron Aluminium nitride (AIN) material is used, but such could in accordance with the invention also e.g. be Beryllium Oxide (BeO). In this manner FIG. 7 illustrates a relatively advantageous manner of putting the principle illustrated along FIG. 4 into practice. The closing plate 16 serves to keep the phase change material in the etched frame, prevents out gassing in a vacuum environment, provides strength to the structure and serves as a flat reference plane.

Apart from the concepts and all pertaining details as described in the preceding, the invention relates to all features as defined in the following set of claims as well as to all details as may directly and unambiguously be derived from the attached figures by one skilled in the art. In the following set of claims, rather than fixating the meaning of a preceding term, any reference numbers corresponding to structures in the figures are, for reason of support at reading the claim, included solely for indicating an exemplary meaning of a preceding term and are for that reason included between brackets.

The invention claimed is:

1. A lithography system for projecting an image or an image pattern onto a target, the system comprising:
   a target carrier comprising:
      a cavity containing a phase change material and an internal heat-conducting frame, and
      a top layer and a bottom layer interconnected by the internal heat-conducting frame, wherein:
         the top layer includes a surface having heat-conducting burls that support the target and thermally connect the target with the phase change material,
         the bottom layer forms a flat reference plane for the top layer, and
         the phase change material and the burls are configured to remove heat from the target in such a manner that expansion caused by local and/or overall heating of said target is limited to a relevant pre-defined value.

2. The system according to claim 1, wherein the percentage of the surface that is made up of the burls is within the range of around 1% to around 5%.

3. The system according to claim 1, wherein a contacting surface of the phase change material is substantially larger than a target surface that is to be processed.

4. The system according to claim 1, wherein the burls comprise silicon.

5. The system according to claim 1, wherein the phase change material has a phase transition from a solid state to a liquid state at a temperature corresponding to that of the operational temperature of the lithography system.

6. The system according to claim 5, wherein the operational temperature is within a range of 20 to 25 degrees Celsius.

7. The system according to claim 1, wherein the burls are integrated with at least part of said top layer.

8. The system according to claim 7, wherein a phase retaining fluid or paste is provided between said burls for optimizing a clamping force between the target and the target carrier.

9. The system according to claim 1, wherein the internal heat-conducting frame comprises rectangular structures, the rectangular structures being filled with the phase changed material within the range of 60% to 90% of the surface area of each rectangular structure.

10. The system according to claim 1, wherein the burls are provided with a thermally conducting layer.

11. A wafer carrier comprising:
   a cavity containing a phase change material and an internal heat-conducting frame, and
   a first and a second wafer-like element interconnected by the internal heat-conducting frame, wherein:
      the first wafer-like element includes a surface that is provided with heat-conducting burls that support a target and thermally connect the target with the phase change material,
      the second wafer-like element forms a flat reference plane for the first wafer-like element, and
      the phase change material and the burls are configured to remove heat from the target in such a manner that expansion caused by local and/or overall heating of said target is limited to a relevant pre-defined value.

12. The wafer carrier of claim 11, wherein the burls comprise silicon.

13. The wafer carrier of claim 11, wherein the percentage of the surface that is made up of the burls is within the range of around 1% to around 5%.

14. The wafer carrier of claim 11, wherein the surface is configured to receive a fluid or paste between the surface and the target.

15. The wafer carrier of claim 11, wherein the burls are provided with a thermally conducting layer.

16. The wafer carrier of claim 11, wherein the phase change material has a phase transition from a solid state to a liquid state at a temperature corresponding to that of the operational temperature of the lithography system.

17. The wafer carrier of claim 16, wherein the operational temperature is within a range of 20 to 25 degrees Celsius.

* * * * *